(12) United States Patent
Li et al.

(10) Patent No.: US 6,753,269 B1
(45) Date of Patent: Jun. 22, 2004

(54) METHOD FOR LOW K DIELECTRIC DEPOSITION

(75) Inventors: Lih-Ping Li, Hsin-Chu (TW); Yung-Chen Lu, Taipei (TW); Syun-Ming Jang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/434,029

(22) Filed: May 8, 2003

(51) Int. Cl.[7] .............................. H01L 21/31
(52) U.S. Cl. ................................... 438/778
(58) Field of Search ............................ 438/778

(56) References Cited

U.S. PATENT DOCUMENTS 5,785,789 A * 7/1998 Gagnon et al. ............. 156/235
6,340,435 B1    1/2002 Bjorkman et al.
6,537,908 B2 * 3/2003 Fornof et al. ............... 438/638

\* cited by examiner

Primary Examiner—David Nelms
Assistant Examiner—Thao P. Le
(74) Attorney, Agent, or Firm—Haynes and Boone, LLP

(57) ABSTRACT

The present disclosure provides a method for forming an intermediate trench layer through low k dielectric material deposition in a damascene process for manufacturing semiconductor devices. After depositing a low k dielectric material block, a curing process is applied to the low k dielectric material block for a predetermined curing time period, wherein after the curing time period, the low k dielectric material block forms a first and second low k dielectric layers so as to make the first low k dielectric layer an intermediate trench layer, thereby eliminating the need of an etch stop layer.

20 Claims, 5 Drawing Sheets

METHOD FOR LOW K DIELECTRIC DEPOSITION

BACKGROUND OF THE INVENTION

The present disclosure relates generally to the fabrication of semiconductor devices, and more particularly, to a method and process for depositing dielectric layers on a substrate.

Semiconductor device geometries have dramatically decreased in size since such devices were first introduced several decades ago. Since then, integrated circuits have generally followed the two year/half-size rule (often called Moore's Law), which means that the number of devices on a chip doubles every two years. Today's fabrication plants are routinely producing devices having 0.35 .mu.m and even 90 nm feature sizes.

In the process of reducing the size of devices on integrated circuits, it has become necessary to use conductive materials having low resistivity and insulators having low dielectric constants (k.ltoreq.4.0) to reduce the capacitive coupling between adjacent metal lines. A conductive material of interest is copper which can be deposited in submicron features by electrochemical deposition. Dielectric materials of interest are silicon oxides that contain carbon. Combination of silicon oxide materials and copper has led to new deposition methods for preparing vertical and horizontal interconnects since copper is not easily etched to form metal lines. Such methods include damascene methods depositing vertical and horizontal interconnects wherein one or more dielectric materials are deposited and etched to form the vertical and horizontal interconnects that are filled with the conductive material.

Dielectric layers can be deposited, etched and filled with metal in multiple steps. Preferred methods for depositing dielectric layers include damascene methods where lines/trenches are filled concurrently with vias/contacts. In a "counter-bore" scheme, a series of dielectric layers are deposited on a substrate, then vertical interconnects such as vias/contacts are etched through all of the layers and horizontal interconnects such as lines/trenches are etched through the top layers. A conductive material is then deposited in both the vertical and horizontal interconnects.

Because the selectivity of etch processes for conventional low k dielectric layers is typically less than 3:1, etch stop layers are needed to provide the desired etch selectivity. The etch stop layers provide uniformity in the depth of horizontal interconnects across the surface of the substrate. The etch stop layers farther reduce micro-trenching such that the bottom of horizontal interconnects are flat instead of deeper at outside edges. The etch stop layers further reduce faceting or fencing of previously etched vertical interconnects during etching of horizontal interconnects, wherein the edge between the bottom of the horizontal interconnects and the side walls of the vertical interconnects are sharp instead of either rounded (i.e., faceted) or raised (i.e., fenced) depending on whether the side walls of the vertical interconnects are exposed to etch gases or shielded from etch gases.

Conventional etch stop layers provide the benefits just described for damascene applications, but typically have dielectric constants that are substantially greater than 4. For example, silicon nitride has a dielectric constant of about 7, and deposition of such an etch stop layer on a low k dielectric layer results in a substantially increased dielectric constant for the combined layers. It has also been discovered that silicon nitride may significantly increase the capacitive coupling between interconnect lines, even when an otherwise low k dielectric material is used as the primary insulator. This may lead to crosstalk and/or resistance-capacitance (RC) delay that degrades the overall performance of the device.

What is needed is a process to form an intermediate trench layer without forming an etch stop layer in a low k material environment during semiconductor processing.

SUMMARY OF THE INVENTION

The present disclosure provides a method for forming an intermediate trench layer through low k dielectric material deposition in a damascene process for manufacturing semiconductor devices. After depositing a low k dielectric material block, a curing process is applied to the low k dielectric material block for a predetermined curing time period, wherein after the curing time period, the low k dielectric material block forms a first and second low k dielectric layers so as to make the first low k dielectric layer an intermediate trench layer, thereby eliminating the need of an etch stop layer.

The intermediate trench layer has a higher density than the second layer of the low k dielectric material. This property satisfies the needs to control future etch process, thus eliminating the need of the using an etch stop layer between the two low k dielectric layers and simplifying the entire low k material deposition process both in terms of processing time and cost. It provides a larger etch window about trench depth and profile control. And since the formation of both layers all will happen in one reaction chamber, it reduces the both the process time and costs. In addition, the increased density of the top layer low k material also enhances the material mechanical property.

DETAILED DESCRIPTION

The present invention provides a method for depositing and etching of low k dielectric layers (i.e., k less than or equal to about 4, preferably less than about 3). The method is suited for selective etch processes such as damascene schemes that deposit conductive materials, such as copper, within interconnects formed in the low k dielectric layers.

Figure 1:
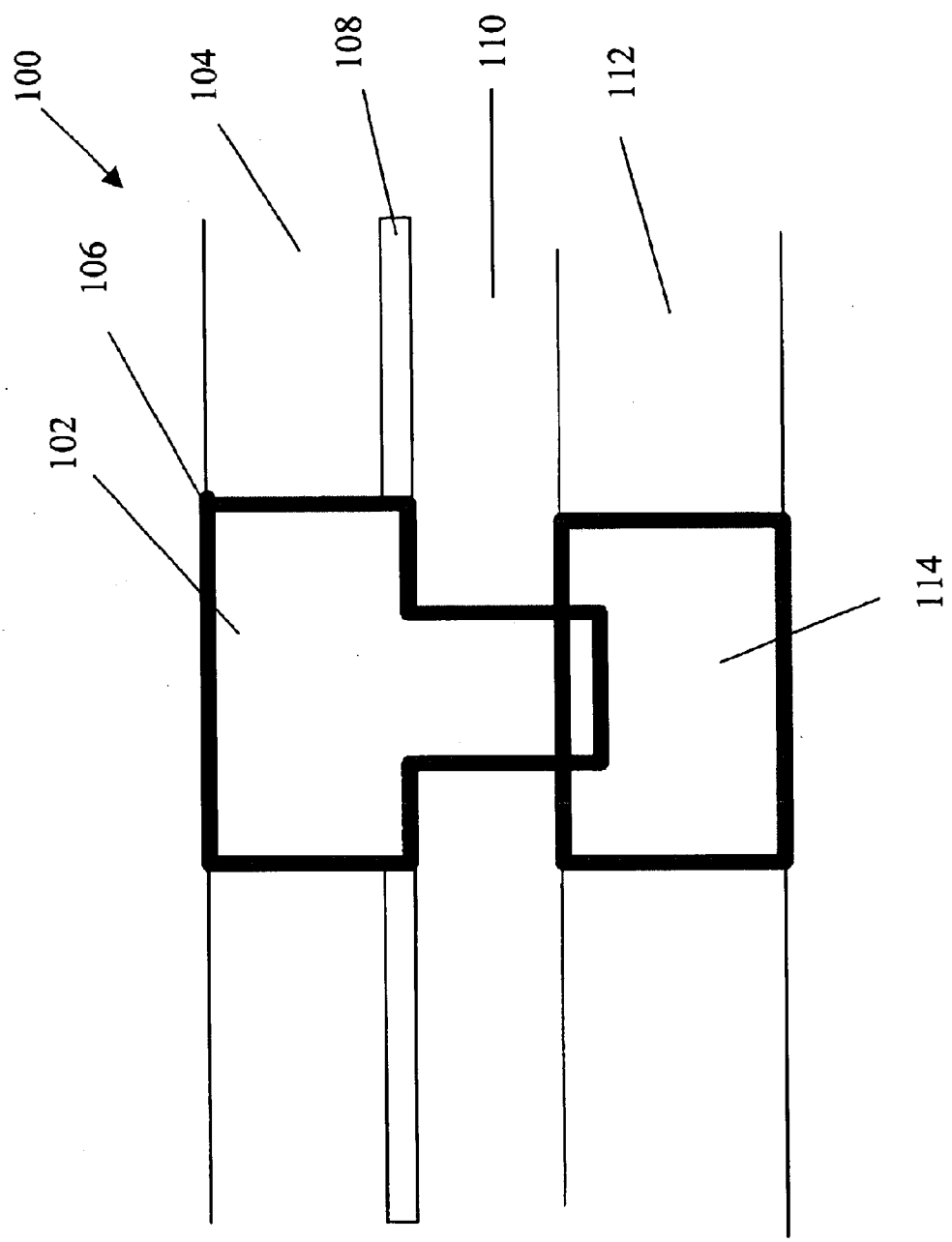
FIG. 1 illustrates a sectional view of a via/interconnect structure.

FIG. 1 illustrates a sectional view of a via/interconnect structure 100 manufactured by conventional processing methods. In this structure, a via 102 is embedded or surrounded by a low k dielectric layer 104. The low k dielectric layer 104 may contain silicon, oxygen, carbon, and hydrogen elements, and have a low dielectric constant (k less than or equal to about 4.0). The low k dielectric material may be spin on low k dielectrics (doped) or a CVD layer deposited by oxidation of an organosilicon compound containing C—H bonds and C—Si bonds. The via 102 is separated from the low k dielectric layer 104 by a barrier layer 106 such as silicon nitride or silicon carbide, that protects the dielectric layers from diffusion of a conductive material such as copper filling in the via 102. Underneath the low k dielectric layer 104, there is a etch stop layer 108, which helps to control the thickness of the low k dielectric layer while the entire structure is going through some etching process. There may be a second low k dielectric layer 110, such as spin on low k dielectrics (doped or undoped) or a CVD layer deposited by oxidation of an organosilicon compound. The second low k dielectric layer may also sit on a prior dielectric substrate 112 wherein the via 102 makes contact with a feature such as a metal line 114.

The first dielectric layer 104 is preferably deposited to a thickness of about 1,000 to about 5,000 .ANG. The second dielectric layer 110 is then deposited to a thickness of about 500 to about 4,000 .ANG. Deposition of low k dielectric layers can be performed using conventional processes for depositing silicon oxides, such as by oxidation of tetraethylorthosilicate (TEOS), also known as tetraethoxysilane. Alternatively, the low k dielectric layers can be produced by oxidation of an organosilicon compound containing both C—H bonds and C—Si bonds, such as methylsilane, dimethylsilane, trimethylsilane, trimethylsiloxane, or any other similar materials. The dielectric layer is cured at low pressure and high temperature to stabilize properties. Carbon or hydrogen which remains in the dielectric layer contributes to low dielectric constants, good barrier properties, and reduced etch rates. The carbon and hydrogen contents of the deposited dielectric layers is controlled by varying process conditions.

Figure 2:
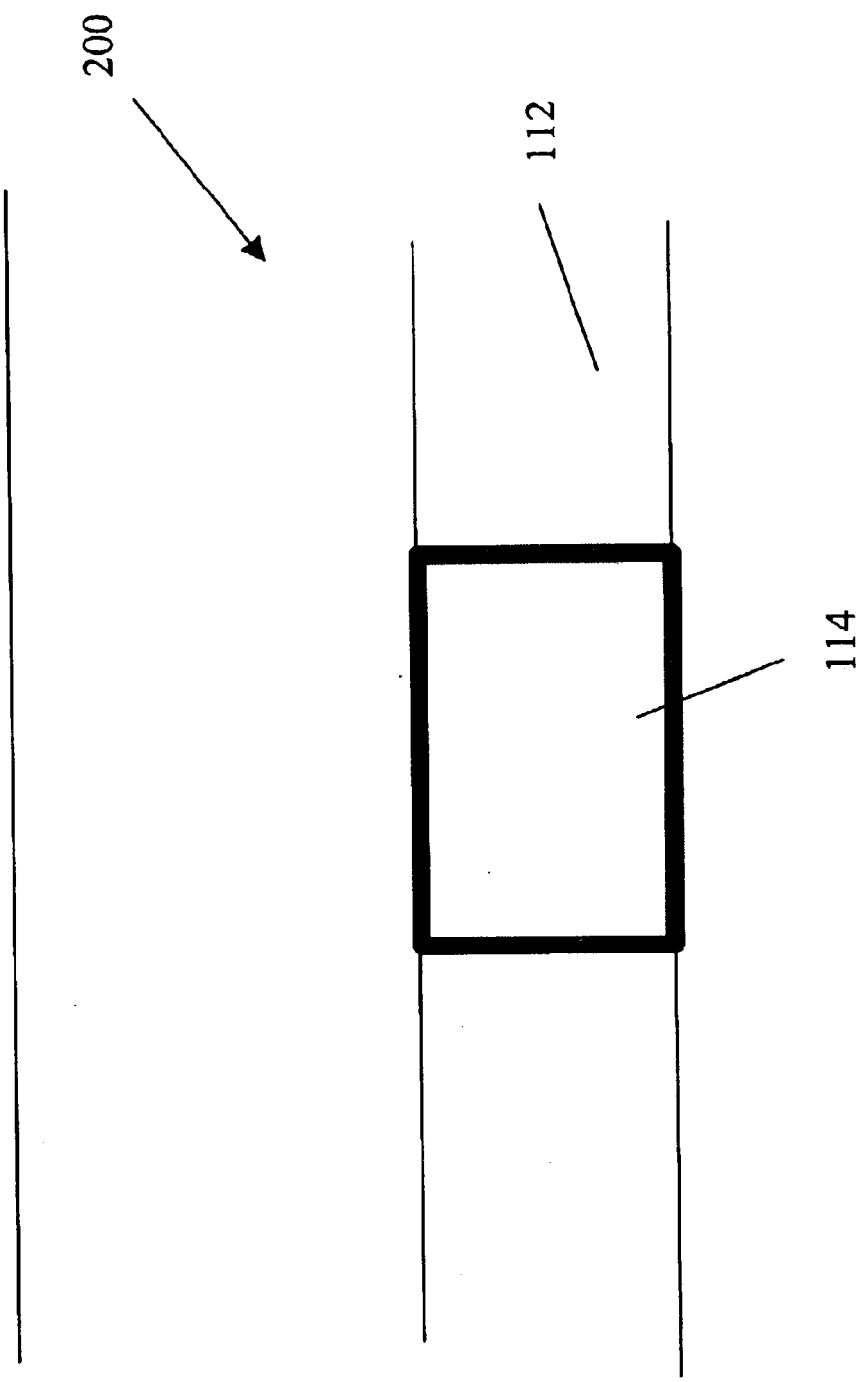
FIGS. 2–5 illustrate sample processing steps to deposit low k dielectric material without using an etch stop layer according to one example of the present invention.

FIGS. 2–5 illustrate sample processing steps to deposit the low k dielectric material without using an etch stop layer according to one example of the present invention. FIG. 2 illustrates that the metal contact 114 is formed on an existing substrate 112, and a layer of low k dielectric material 200 of a predetermined thickness is deposited on top of the substrate 112 and metal 114. The initial thickness of the low k dielectric material 200 can be approximately 6500 .ANG. The general process for depositing the low k dielectric material can be the similar to the conventional methods. However, it would be preferred that a low temperature condition is used. In one example, the deposition is performed at the temperature below 300° C., preferably below 50° C. such as around 35° C. At the this relative cold temperature range, the deposited layer is partially polymerized during deposition and polymerization is completed during subsequent curing of the layer.

The subsequent curing process is done by a process referred to as a low power curing process. In addition to setting the energy level, the power of the curing process is actively controlled by varying the curing time. For example, a plasma curing is performed for about 3 to 10 minutes at a temperature of about 400° C. In some embodiment of the present invention, the plasma energy level is set around or below 2000 W and the curing duration is about 6 minutes. The plasma curing can be a remote plasma curing as well as a radio frequency plasma curing.

Figure 3:
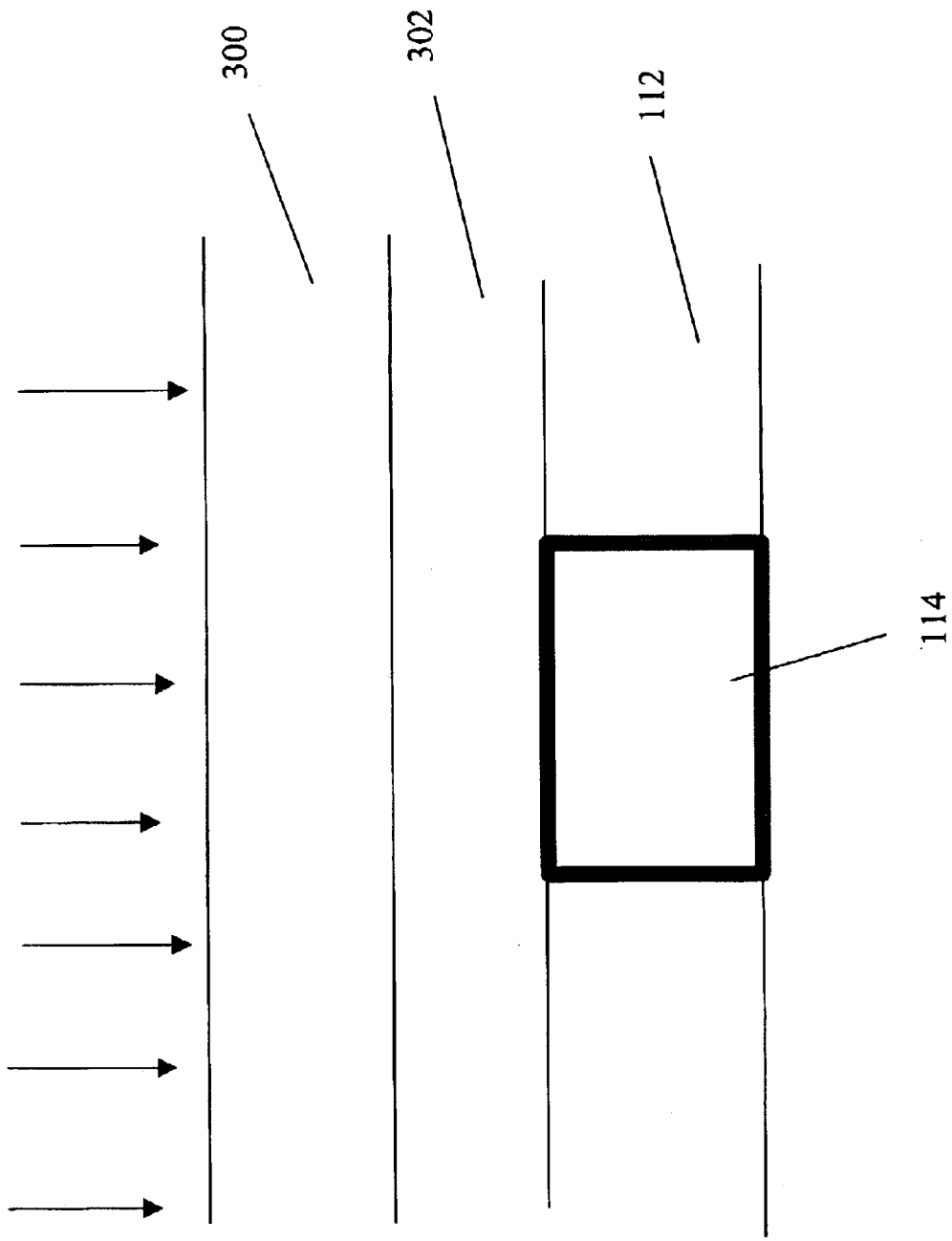
Figure 4:
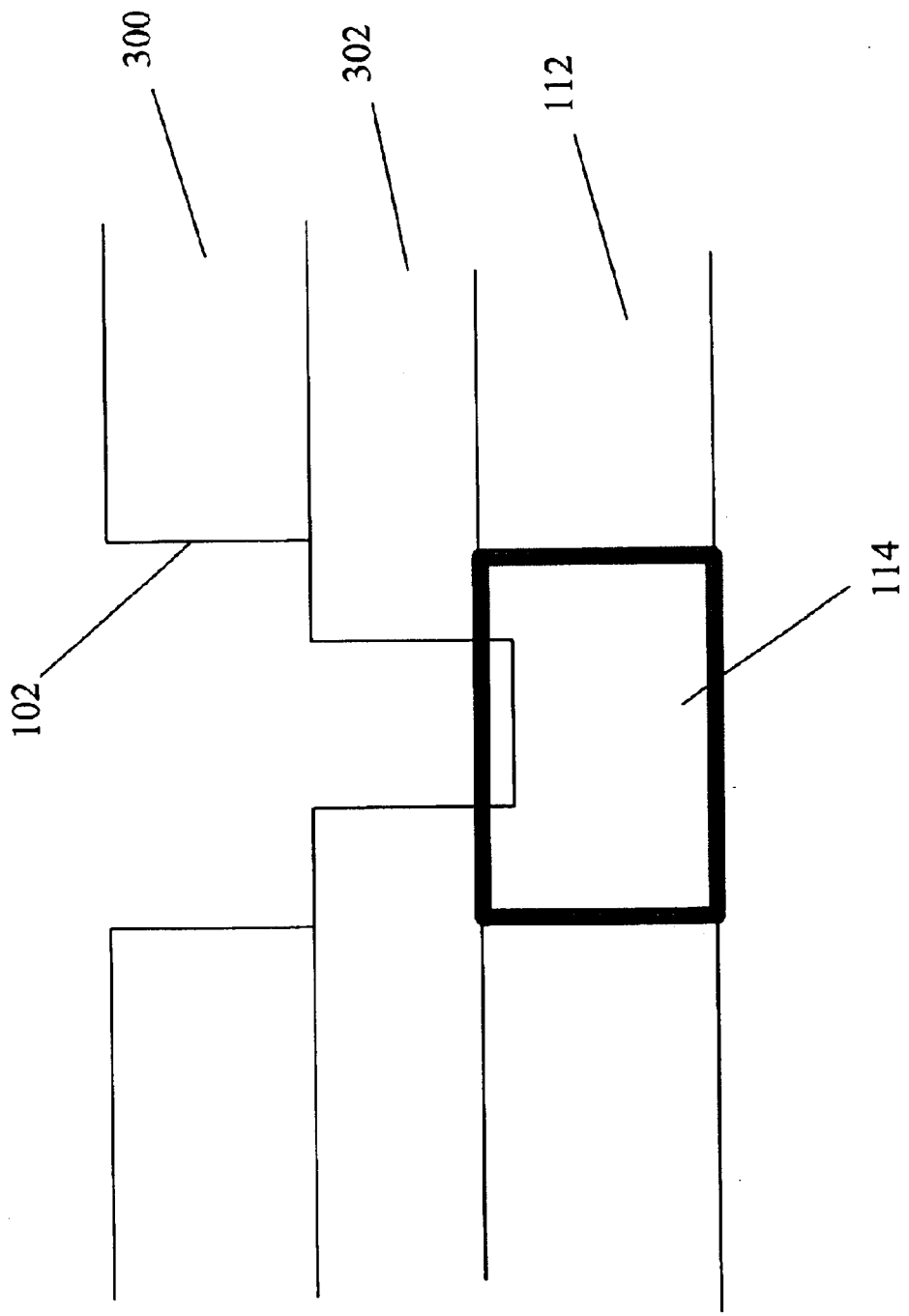
Figure 5:
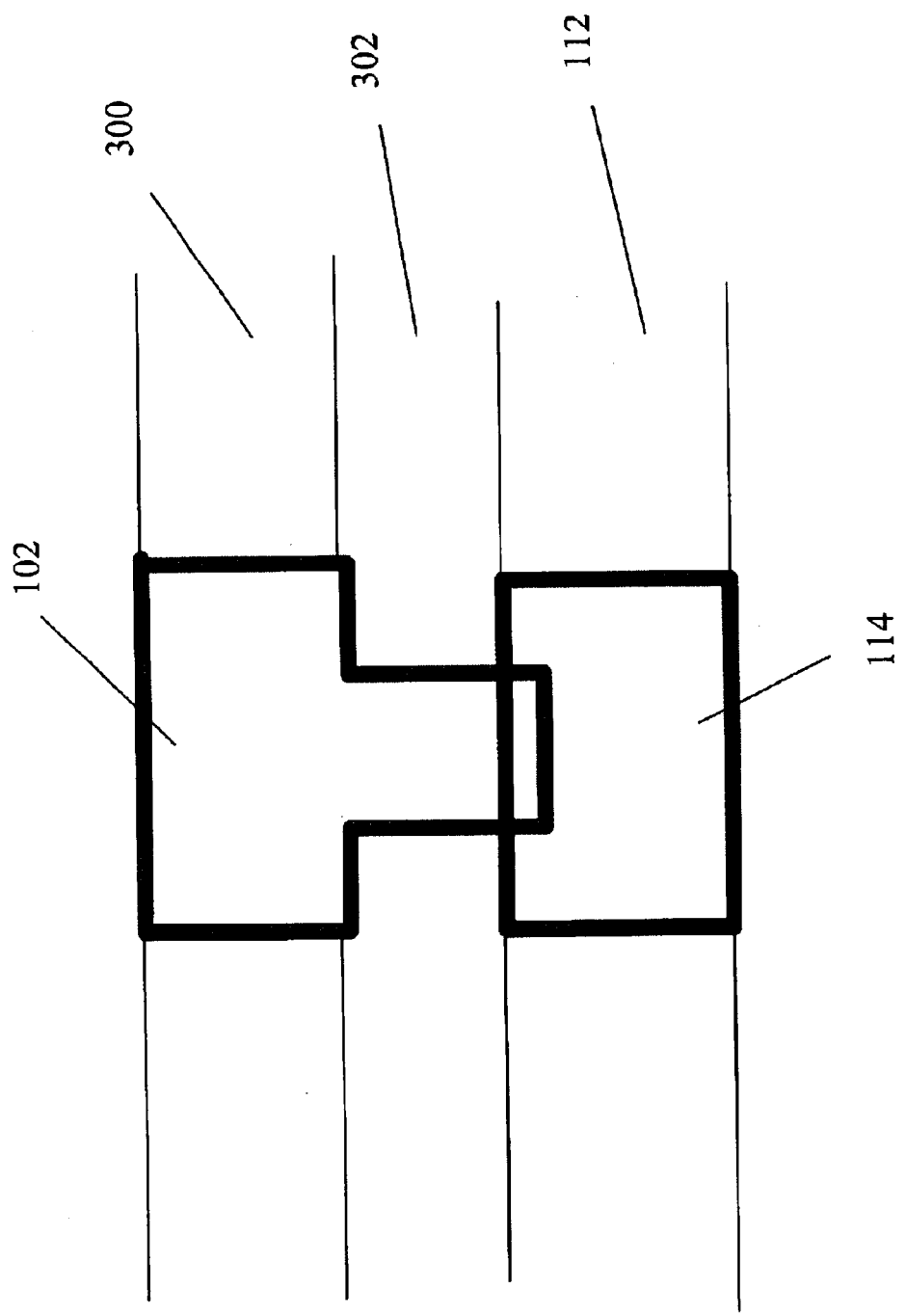

FIG. 3 illustrates the result of the plasma curing in which the one layer of low k dielectric material is now controlled and separated into two layers 300 and 302. The top layer 300 has its physical characteristics that is different from the second layer 302 due to the fact that these two layers have different compositions caused by the low temperature deposition and controlled low power curing. One feature for these two layers is that the top layer or the trench layer 300 has an etch rate much lower than the lower layer 302 due to its higher density than the lower one 302. The thickness of the trench layer 300 is about 2000 to 4000 .ANG.

It is thus noted that the above described process does not need an etch stop layer to be separately formed. The difference in the etch rate between the top layer and the lower layer of the low k dielectric material satisfy the needs to control the etch process, thus eliminating the need of the using an etch stop layer between the two low k dielectric layers and simplifying the entire low k material deposition process both in terms of processing time and cost. It thus provides a larger etch window about trench depth and profile control. And since the formation of both layers all will happen in one reaction chamber, it reduces the both the process time and costs. In addition, the increased density of the top layer low k material also enhances the material mechanical property.

It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A method for forming a low k dielectric material block in a damascene process, the method comprising:
    forming the low k dielectric material block using low temperature deposition; and
    curing the low k dielectric material block for a predetermined curing time period,
    wherein after the curing time period, the low k dielectric material block forms a first on top of a second low k dielectric layers, and the first low k dielectric layer has a higher density than the second low k dielectric layer.

2. The method of claim 1 wherein the curing is a low power curing.

3. The method of claim 2 wherein the low power curing is a plasma curing.

4. The method of claim 3 wherein the plasma curing is conducted at a temperature about 350°–450° C.

5. The method of claim 3 wherein the predetermined time period for the plasma curing is about 3–10 minutes.

6. The method of claim 3 wherein the plasma curing is conducted at an energy level of about 2000 watts.

7. The method of claim 1 wherein the low temperature deposition is at a temperature below 300° C.

8. The method of claim 1 wherein the low temperature deposition is at a temperature below 50° C.

9. The method of claim 1 wherein the first layer has a thickness in the range of 2000 to 4000 .ANG.

10. A method for forming a low k dielectric material block comprising:
    forming the low k dielectric material block under a relatively low temperature below 300° C.; and
    curing the low k dielectric material block for a predetermined curing time period using a low power,
    wherein after the curing time period, the low k dielectric material block forms a first low k dielectric layer having a higher density on top of a second low k dielectric layer so as to make the first low k dielectric layer a trench layer, thereby eliminating the need of an etch stop layer above the second low k dielectric layer.

11. The method of claim 10 wherein the low power curing is conducted at a temperature about 350°–450° C.

12. The method of claim 10 wherein the predetermined time period for the low power curing is more than 3 minutes.

13. The method of claim 10 wherein the low power curing is conducted at an energy level around or below 2000 watts.

14. The method of claim 10 wherein the low temperature deposition is at a temperature below 50° C.

15. The method of claim 10 wherein the first layer has a thickness around or below 4000 .ANG.

16. The method of claim 10 wherein the low power curing is a remote plasma curing or a radio frequency plasma curing.

17. A method for forming an intermediate trench layer through a low k dielectric material deposition in a damascene process, the method comprising:

forming the low k dielectric material block under a relatively low temperature below 100° C.; and curing the low k dielectric material block for a predetermined curing time period using a low power plasma curing process, wherein after the curing time period, the low k dielectric material block forms a first low k dielectric layer having a relative higher density on top of a second low k dielectric layer so as to make the first low k dielectric layer an intermediate trench layer, thereby eliminating the need of an etch stop layer above the second low k dielectric layer.

18. The method of claim 17 wherein the plasma curing process is a remote plasma curing process or a radio frequency plasma curing process.

19. The method of claim 17 wherein the curing time period is more than 3 minutes.

20. The method of claim 17 wherein the relative low temperature is around 35° C.

* * * * *